United States Patent

Saito

[11] Patent Number: 5,861,833
[45] Date of Patent: Jan. 19, 1999

[54] RUNAWAY PREVENTION IN A REMOTE CONTROLLER

[75] Inventor: Minoru Saito, Yamagata, Japan

[73] Assignee: NEC Corporation, Tokyo, Japan

[21] Appl. No.: 705,559

[22] Filed: Aug. 29, 1996

[30] Foreign Application Priority Data

Aug. 30, 1995 [JP] Japan .................................. 7-222395

[51] Int. Cl.⁶ .................................................. G08C 19/12
[52] U.S. Cl. ............................................ 341/176; 361/93
[58] Field of Search ....................... 340/825.22, 825.69, 340/361, 825.72; 361/93, 94; 395/182.21, 750.05; 341/176, 22

[56] References Cited

U.S. PATENT DOCUMENTS

| | | | |
|---|---|---|---|
| 4,984,124 | 1/1991 | Yeh | 361/93 |
| 5,237,698 | 8/1993 | Ohmae | 395/182.21 |
| 5,305,175 | 4/1994 | Yeh | 361/94 |
| 5,414,861 | 5/1995 | Horning | 395/182.21 |
| 5,629,694 | 5/1997 | Simon | 341/22 |

Primary Examiner—Brian Zimmerman
Attorney, Agent, or Firm—Young & Thompson

[57] ABSTRACT

A remote controller includes an oscillation circuit for generating a basic clock signal; a read only memory for storing program data; a central processing unit electrically connected to the oscillation circuit and the read only memory for fetching output data from the read only memory and generating a remote control signal; a key matrix; a key source circuit connected to the key matrix; a key return circuit connected to the key matrix; and a reset circuit electrically connected to the central processing unit, the oscillation circuit and the key return circuit. The reset circuit places at least the central processing unit in a reset state after power has been input and if any key input appears on the key matrix, and then releases the central processing unit from the reset state before having the central processing unit return to the reset state.

3 Claims, 5 Drawing Sheets

RUNAWAY PREVENTION IN A REMOTE CONTROLLER

BACKGROUND OF THE INVENTION

The present invention relates to a remote controller, and more particularly to a remote controller with an added feature for prevention of runaway of the controller's control processing unit.

In the prior art, the remote controller was used to control TV and VTR and the like. The remote controller is provided with a CPU and a key matrix as an input means. Such remote controller is driven by a battery.

FIG. 1 is a circuit diagram illustrative of a circuit configuration of the conventional remote controller. An oscillation circuit 1 is provided for generating a basic clock signal CLK. A read only memory ROM 4 is provided for storing control programs. A key matrix 10 is provided. A key source circuit 3 is provided to be connected to the key matrix 10. A key return circuit 9 is provided to be connected to the key matrix 10. A central processing unit CPU 5 is provided to be connected to the read only memory ROM 4 for inputting address signals PC into the read only memory ROM 4 and fetching output signals DAT from the read only memory ROM 4. The central processing unit CPU 5 is also connected to the oscillation circuit 1 for inputting a stop signal STOP into the oscillation circuit 1 and fetching clock signal CLK from the oscillation circuit 1. The central processing unit CPU 5 is also connected to an output port 2 for feeding a remote control signal REM to the output port 2. The central processing unit CPU 5 is also connected to the key source circuit 3 for supplying a set signal SET into the key source circuit 3. The central processing unit CPU 5 is also connected to the key return circuit 9 via a data bus 8 for fetching data from the key return circuit 9. A pull-up resistor 6 and a capacitor 7 are connected in series between a high voltage power line and a ground line. An intermediate point between the pull-up resistor 6 and the capacitor 7 is connected to the oscillation circuit 1 and the central processing unit CPU 5 for generating a reset signal RESN when power is input and supplying the reset signal RESN to both the oscillation circuit 1 and the central processing unit CPU 5.

When the power is input, then the reset signal RESN remains at a low level until the capacitor 7 is charged up by the pull-up resistor 6 so as to reset the oscillation circuit 1 and the central processing unit CPU 5. Thereafter, the central processing unit CPU 5 receives the clock signal CLK from the oscillation circuit 1 thereby inputting address signals PC into the read only memory ROM 4. The read only memory ROM 4 reads out data stored in a designated address by the received address signal PC for subsequently feeding the data as the data signals DAT to the central processing unit CPU 5. The central processing unit CPU 5 receives the data signals DAT from the read only memory ROM 4 and then supplies the set signal SET to the key source circuit 3 for setting operations of the key source circuit 3. as well as supplies the stop signal STOP to the oscillation circuit 1 for stopping the operation of the oscillation circuit 1. Subsequently, the central processing unit CPU 5 enters a stand-by state.

FIG. 2 is a circuit diagram illustrative of the key matrix 10, the key source circuit 3 and the key return circuit 9. The key source circuit 3 comprises a plurality of n-channel transistors 31, 32 and 33, each of which has a gate connected to the central processing unit CPU 5 for receiving the set signal SET, a drain connected to the ground line and a source connected to the row of the key matrix 10. The key return circuit 9 comprises a plurality of pull-up resistors 91, 92 and 93, each of which has one side connected to the power line and the opposite side connected to the column of the key matrix 10 and the central processing unit CPU 5. If any one of the keys in the key matrix 10 is pushed on, then the one of the transistors 31, 32 and 33 connected to the selected key is connected via the selected key to the one of the pull-up resistors 91, 92 and 93. At this time, if any one of the key data is changed from a high level to a low level and the key data is fed to the central processing unit CPU 5, then the central processing unit CPU 5 is released from the stand-by state to generate the remote control signal REM on the basis of the data DAT from the read only memory ROM 4 and the clock signal CLK from the oscillation circuit 1. The generated remote control signal REM is fed from the central processing unit CPU 5 into the output port 2.

The remote controller described above is designed to be driven by the battery. After the power was input, then the reset signal RESN has was input into the central processing unit CPU 5 and the oscillation circuit 1 until the capacitor 7 is charged up by the pull-up resistor 6, during which the capacitor 7 remains charged. For this reason, so long as the battery is charged, the reset operation does not take place whereby the output from the read only memory ROM 4 varies due to a variation of power due to external noises and elimination of infrared laser emitted diode. The variation in the output from the read only memory ROM 4 may cause runaway of the central processing unit CPU 5.

Further if the power voltage is low which is critical for operational limitation, then any variation in voltage of the power is likely to appear. If the power voltage is dropped under the critical level for operational limitation, this causes the runaway of the central processing unit CPU 5. If the runaway of the central processing unit CPU 5 was once caused, then the runaway of the central processing unit CPU 5 will remain even after the power voltage is raised again above the critical level for operational limitation.

Furthermore, if the battery fails and is exchanged, since the capacitor is provided between the power line and the ground line for keeping the data it is possible that the power voltage will recover before the power voltage is dropped to the ground voltage. In summary, in this case, it is difficult to reset the central processing unit CPU 5 and the oscillation circuit 1 by the reset signal RESN, resulting in that the runaway remains.

In the above circumstances, it is required to develop a remote controller capable of releasing within a short time the central processing unit CPU 5 from runaway caused by a variation of the power voltage and external noises.

SUMMARY OF THE INVENTION

Accordingly, it is an object of the present invention to provide an improved remote controller capable of releasing within a short time a central processing unit CPU from runaway caused by a variation of a power voltage and external noises.

The above and other objects, features and advantages of the present invention will be apparent from the following descriptions.

The present invention provides a remote controller comprising: an oscillation circuit for generating a basic clock signal; a read only memory for storing program data; a central processing unit electrically connected to the oscillation circuit and the read only memory for fetching output data from the read only memory and generating a remote control signal; a key matrix; a key source circuit connected to the key matrix; a key return circuit connected to the key matrix; and a reset circuit electrically connected to the central processing unit, the oscillation circuit and the key return circuit. The reset circuit places at least the central processing unit in a reset state after power input, and, if any key input appears on the key matrix, releases the central processing unit from the reset state before having the central processing unit return into the reset state.

The reset circuit has a plurality of binary flip flops for counting reset signals in power input; logic gates connected between the key return circuit and the binary flip flops for determining a reset timing of the binary flip flops on the basis of key data from the key return circuit; and a series connection of a transistor and a resistor between a power line and a ground line and both being provided on an output stage of the reset circuit for generating the reset signal.

The above reset circuit may have an OR gate for supplying a reset timing signal to any one of the binary flip flops wherein an input port and the gates have two inputs.

BRIEF DESCRIPTIONS

Preferred embodiments of the present invention will be described in detail with reference to the accompanying drawings.

PREFERRED EMBODIMENTS

Figure 1:
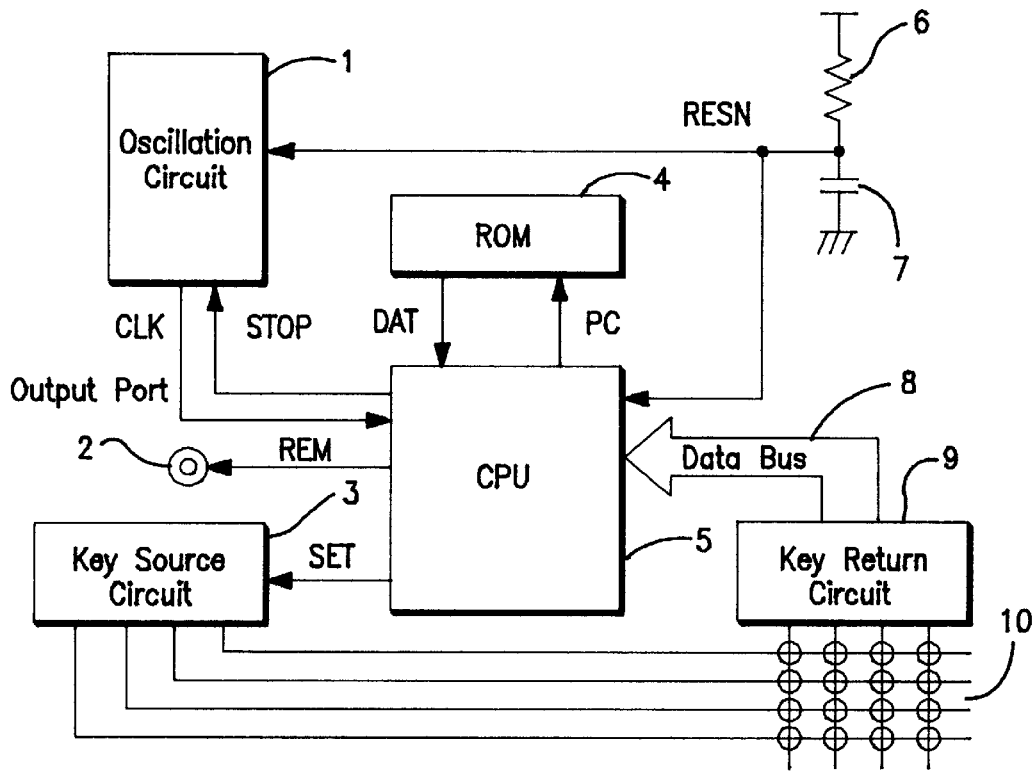
FIG. 1 is a circuit diagram illustrative of a circuit configuration of the conventional remote controller.
Figure 2:
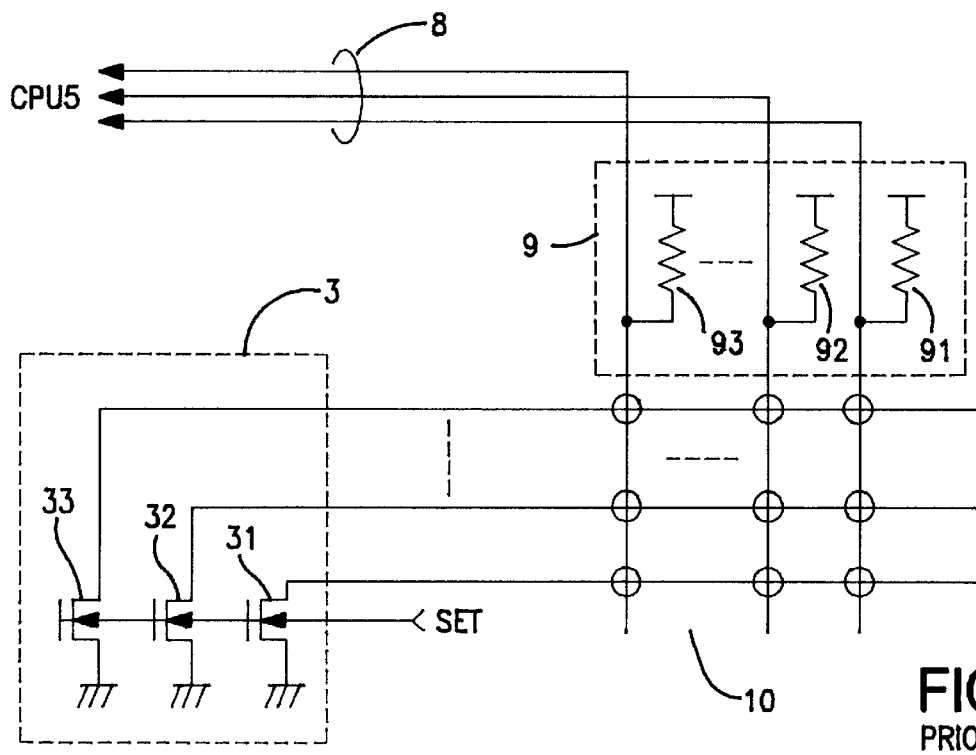
FIG. 2 is a circuit diagram illustrative of the key matrix, the key source circuit and the key return circuit.
Figure 3:
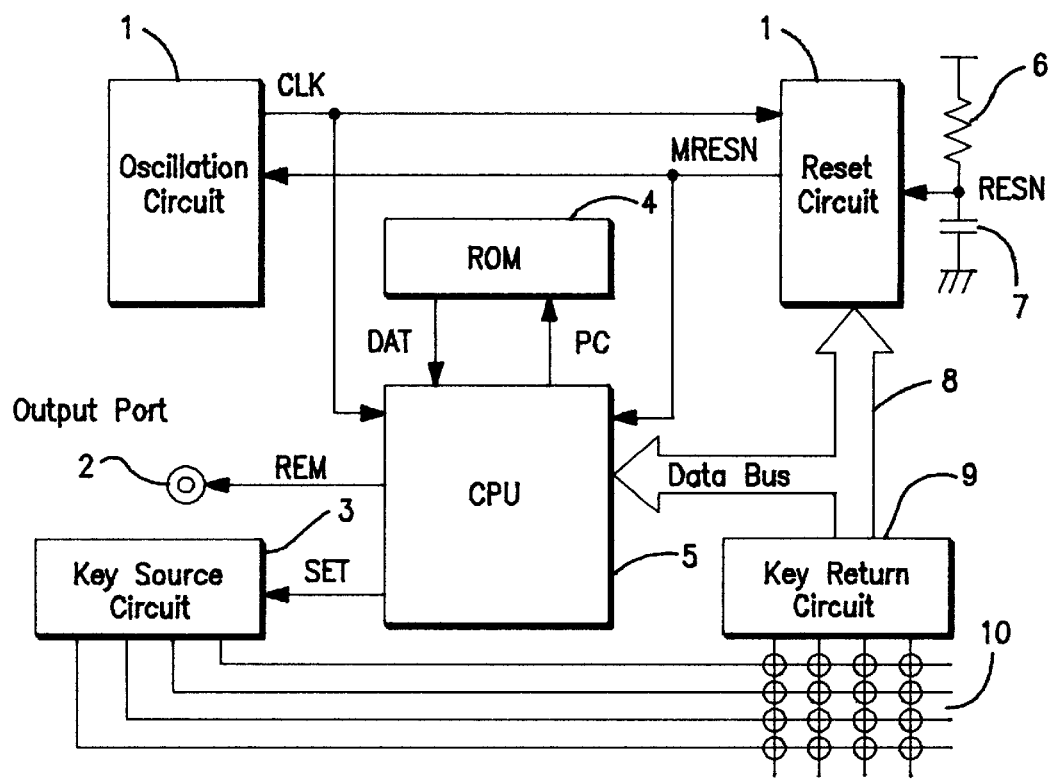
FIG. 3 is a circuit diagram illustrative of a circuit configuration of an improved remote controller in a first embodiment according to the present invention.

A first embodiment according to the present invention will be described in detail. FIG. 3 is a circuit diagram illustrative of a circuit configuration of an improved remote controller in a first embodiment according to the present invention. An oscillation circuit 1 is provided for generating a basic clock signal CLK. A read only memory ROM 4 is provided for storing control programs. A key matrix 10 is provided. A key source circuit 3 is provided to be connected to the key matrix 10. A key return circuit 9 is provided to be connected to the key matrix 10. A central processing unit CPU 5 is provided to be connected to the read only memory ROM 4 for supplying address signals PC into the read only memory ROM 4 and fetching output signals DAT from the read only memory ROM 4. The central processing unit CPU 5 is also connected to the oscillation circuit 1 for fetching clock signals CLK from the oscillation circuit 1. The central processing unit CPU 5 is also connected to an output port 2 for feeding a remote control signal REM to the output port 2. The central processing unit CPU 5 is also connected to the key source circuit 3 for supplying a set signal SET into the key source circuit 3. The central processing unit CPU 5 is also connected to the key return circuit 9 via a data bus 8 for fetching data from the key return circuit 9. A pull-up resistor 6 and a capacitor 7 are connected in series between a high voltage power line and a ground line for generating a reset signal RESN at an intermediate point between the pull-up resistor 6 and the capacitor 7 when a power is input.

A reset circuit 11 is further provided to be electrically connected to the intermediate point between the pull-up resistor 6 and the capacitor 7 for receiving the reset signal RESN. The reset circuit 11 is also electrically connected to the key return circuit 9 via the data bus for receiving key data from the key return circuit 9. The reset circuit 11 is also electrically connected to the oscillation circuit 1 for supplying a reset signal to the oscillation circuit 1. The reset circuit 11 is also electrically connected to the central processing unit CPU 5 for supplying a reset signal to the central processing unit CPU 5. When power is input, the reset circuit 11 receives the reset signal RESN from the intermediate point between the pull-up resistor 6 and the capacitor 7 and generates the reset signal MRESN to place the oscillation circuit 1 and the central processing unit CPU 5 in the reset state. During this, if the reset circuit 11 receives key data from the key return circuit 9, then the reset circuit 11 releases the oscillation circuit 1 and the central processing unit CPU 5 at once from the reset state in a predetermined short time period.

Particularly, if all of the key data from the key return circuit 9 are in high level, then the reset circuit 11 supplies the reset signal MRESN to place the oscillation circuit 1 and the central processing unit CPU 5 in the reset state. If, however, at least any one of the key data from the key return circuit 9 enters in low level, then the reset circuit 11 discontinues the supply of the reset signal MRESN to release the oscillation circuit 1 and the central processing unit CPU 5 from the reset state. If the reset signal MRESN is in the low level, this means active level. When power is input, the reset signal MRESN becomes active or low level whereby the oscillation circuit 1 and the central processing unit CPU 5 are initialized.

Figure 4:
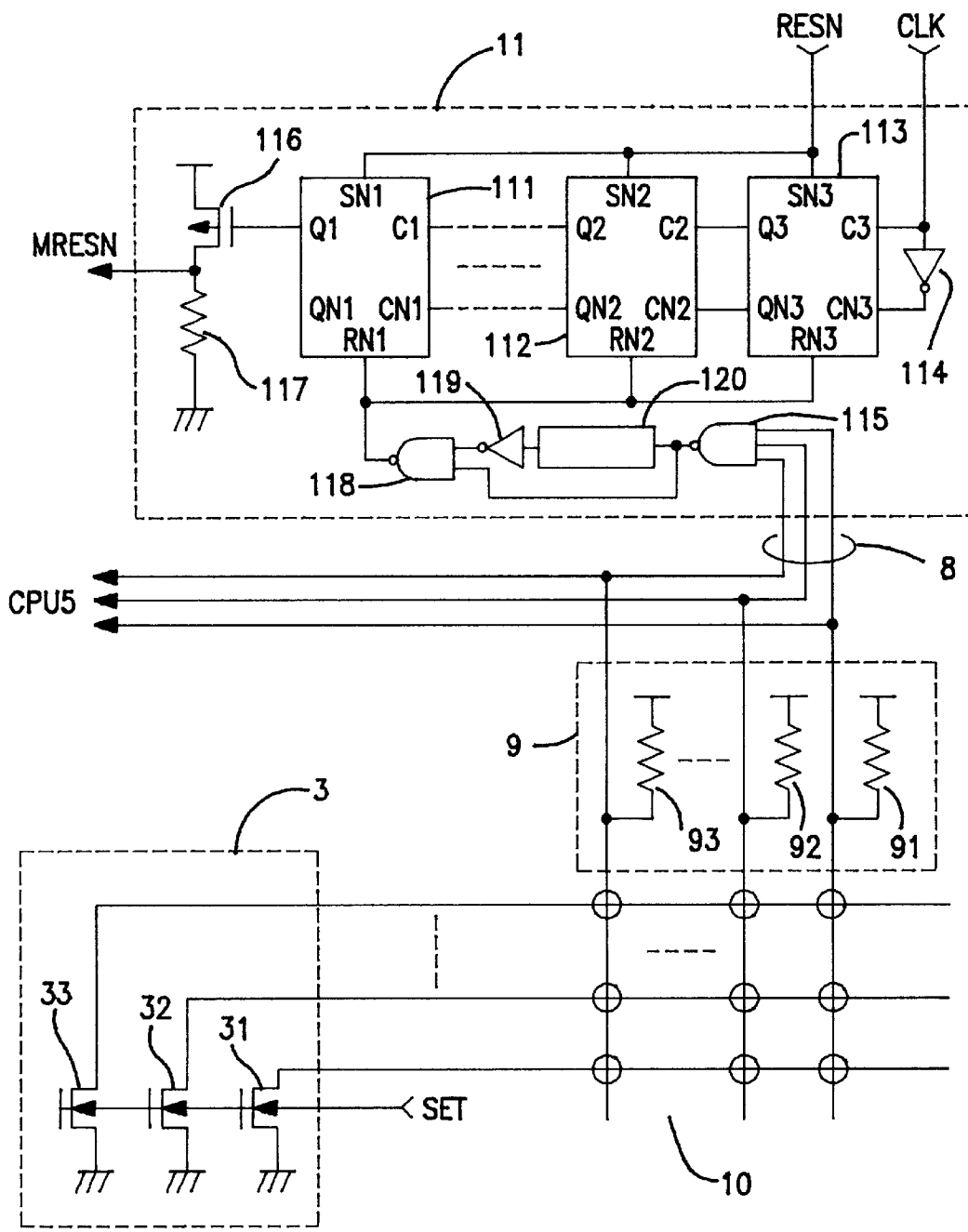
FIG. 4 is a circuit diagram illustrative of a key matrix, a key source circuit, a key return circuit and a reset circuit provided in an improved remote controller in a first embodiment according to the present invention.

FIG. 4 is a circuit diagram illustrative of a key matrix, a key source circuit, a key return circuit and a reset circuit provided in an improved remote controller in a first embodiment according to the present invention. The key source circuit 3 comprises a plurality of n-channel transistors 31, 32 and 33, each of which has a gate connected to the central processing unit CPU 5 for receiving the set signal SET, a drain connected to the ground line and a source connected to the row of the key matrix 10. The key return circuit 9 comprises a plurality of pull-up resistors 91, 92 and 93, each of which has one side connected to the power line and the opposite side connected to the column of the key matrix 10 and the central processing unit CPU 5. If any one of the keys in the key matrix 10 is pushed, then the one of the transistors 31, 32 and 33 connected to the selected key is connected via the selected key to the one of the pull-up resistors 91, 92 and 93.

The reset circuit 11 comprises binary flip flop circuits 111–113, each of which has a set input for receiving the reset signal RESN when the power is input and serves as a counter. An invertor 114 is connected between a C3 input and a CN3 input of the binary flip flop circuit 113 for inverting the basic clock signal CLK. A NAND gate 115 is provided for receiving the key data from the key return circuit 9 via the data bus 8. A delay circuit 120 is provided for receiving the output from the NAND gate 115. An invertor 119 is provided for receiving the output from the delay circuit 120. A NAND gate 118 is provided for receiving an output from the invertor 119 and an output from the NAND gate 115. The output of the NAND gate 118 is connected to RN1, RN2 and RN3 of the binary flip flop circuits 111, 112 and 113. A p-channel transistor 116 and a pull-down resistor 117 are connected in series between a power line and a ground line. The p-channel transistor 116 and the pull-down resistor 117 are provided on an output stage of the binary flip flop circuits 111, 112 and 113. A gate electrode of the transistor 116 is connected to an output terminal Q1 of the binary flip flop circuit 111. The reset signal MRESN is generated at an intermediate point of the p-channel transistor 116 and the pull-down resistor 117.

If any one of the key data from the key data return circuit 9 is changed from high level to low level, then the output of the NAND gate 115 is also changed from low level to high level. This high level output of the NAND gate 115 is input into the delay circuit 120 and one input terminal of the NAND gate 118. Another input terminal of the NAND gate 118 receives the output from the invertor 119. Then, the NAND gate 118 continues to output the low level signal until any of the inputs becomes low level.

The output of the NAND gate 118 is supplied to the reset inputs RN1, RN2 and RN3 of the binary flip flop circuits 111, 112 and 113 to place the binary flip flop circuits 111, 112 and 113 in the reset states. The binary flip flop circuits 111, 112 and 113 have been set by the reset signal RESN input into the set input terminals SN1, SN2 and SN3 in the power input, for which reason the output terminal Q1 of the binary flip flop circuit 111 is changed from the high level into the low level thereby causing the transistor 116 to turn on. As a result, the reset signal MRESN to be supplied to the oscillation circuit 1 and the central processing unit CPU 5 is changed from the low level to the high level so as to release the read only memory 4 and the central processing unit CPU 5 from the reset states.

After the read only memory 4 and the central processing unit CPU 5 are released from the reset states, the central processing unit CPU 5 and the reset circuit 11 receive the basic clock signal CLK from the oscillation circuit 1. The basic clock signal CLK is supplied to the C3 input of the binary flip flop circuit 113 and the invertor 114.

On the other hand, the central processing unit CPU 5 receives the basic clock signal CLK and then counts the binary flip flop circuits 111, 112 and 113 in the reset circuit 11. After a predetermined time period, the central processing unit CPU 5 renders the output terminal Q1 of the binary flip flop circuit 111 high level again whereby the p-channel transistor 116 turns off. This allows the pull-down resistor 117 to render the reset signal MRESN low level, resulting in the reset states of the oscillation circuit 1 and the central processing unit CPU 5.

If the key input appears on the key matrix 10, then the read only memory 4 and the central processing unit CPU 5 are released from the reset states and in the predetermined time period the read only memory 4 and the central processing unit CPU 5 are placed in operational states and thereafter the read only memory 4 and the central processing unit CPU 5 enter into the reset states again. This prevents the central processing unit CPU 5 from entering the runaway state.

Figure 5:
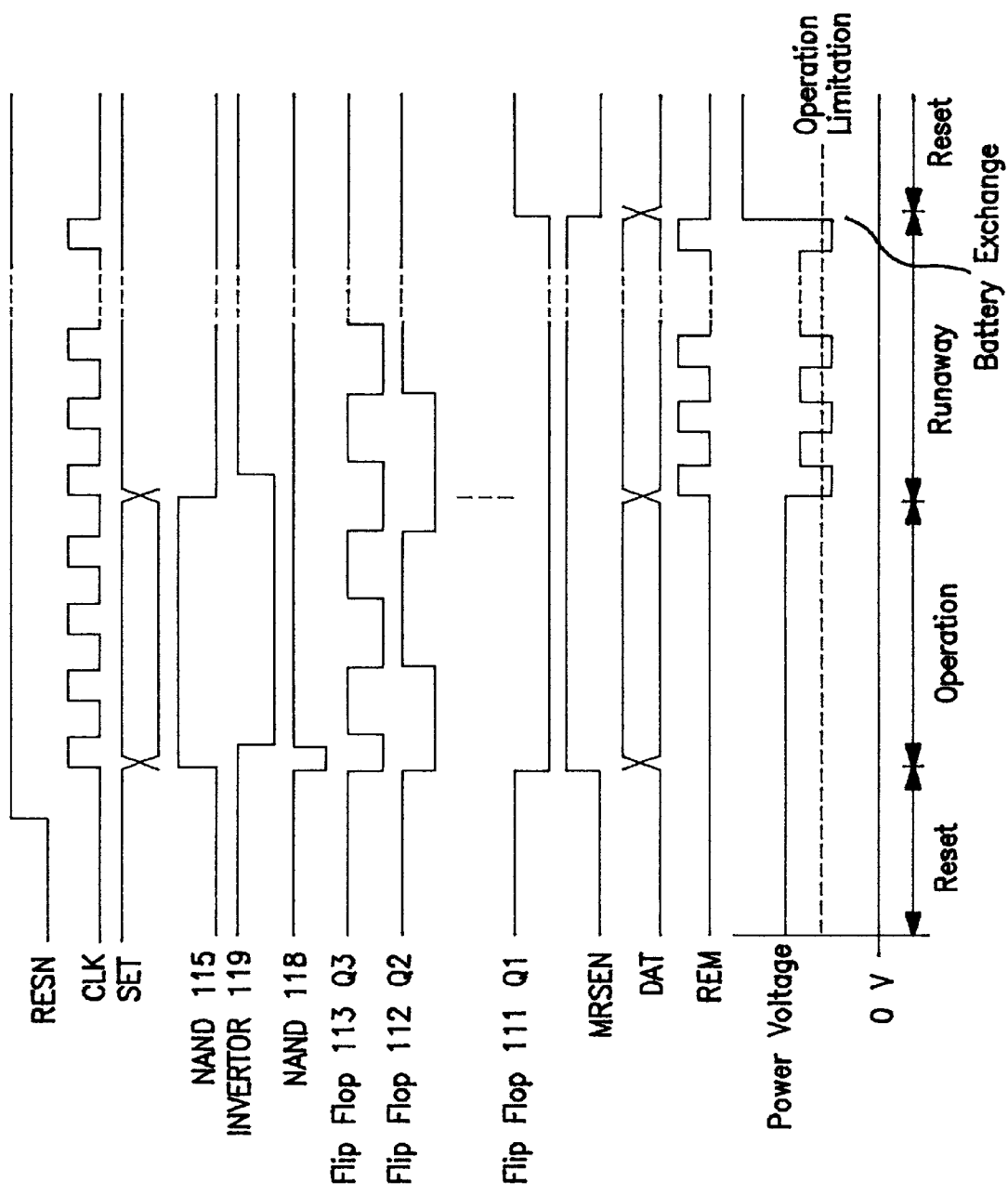
FIG. 5 is a timing chart illustrative of waveforms of various signals transmitted in an improved remote controller in a first embodiment according to the present invention.

FIG. 5 is a timing chart illustrative of waveforms of various signals transmitted in an improved remote controller in a first embodiment according to the present invention. After the power input, the reset signal RESN is generated whereby the read only memory 4 and the central processing unit CPU 5 enter into the reset states. During this, if any key input appears on the key matrix 10, then the output of the NAND agate 115 is changed from the low level to the high level whereby the binary flip flop circuits 111, 112 and 113 are placed in the reset states. As a result, the reset signal MRESN is changed from the low level to the high level whereby the basic clock signal CLK is input into the reset circuit 11 for counting up operations until the output Q1 of the binary flip flop circuit 111 becomes high level before the read only memory 4 and the central processing unit CPU 5 again enter into the reset states.

Further, it may be possible to provide an external capacitor between the power line and the ground line so that if the read only memory 4 and the central processing unit CPU 5 enter into the runaway by the variations in the power voltage due to generation of the remote control signal REM, it is possible to initialize the read only memory 4 and the central processing unit CPU 5 by the reset signal MRESN even without having the reset signal RESN in the power input enter into the low level.

Even if it were difficult to provide the external capacitor between the power line and the ground line, it is possible to initialize the read only memory 4 and the central processing unit CPU 5 by the reset signal RESN in the power input.

A second embodiment according to the present invention will be described. An improved remote controller of the second embodiment according to the present invention has the same circuit configurations as those in the first embodiment except for the reset circuit. The following descriptions will focus on the circuit configuration and operations of the reset circuit.

Figure 6:
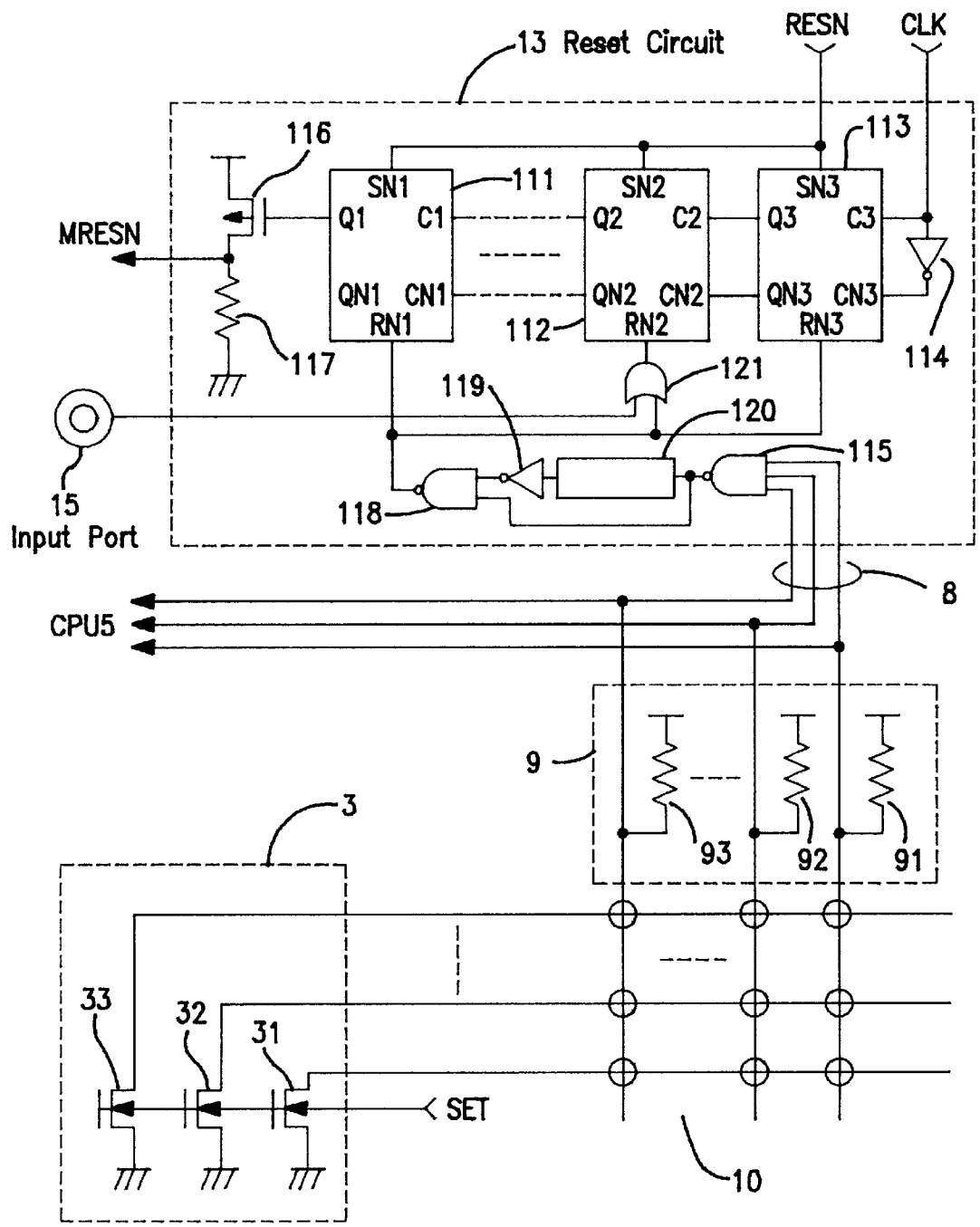
FIG. 6 is a circuit diagram illustrative of a key matrix, a key source circuit, a key return circuit and a reset circuit provided in an improved remote controller in a second embodiment according to the present invention.

FIG. 6 is a circuit diagram illustrative of a key matrix, a key source circuit, a key return circuit and a reset circuit provided in an improved remote controller in a second embodiment according to the present invention. A reset circuit 13 of the second embodiment according to the present invention differs in providing an OR gate 121 from the reset circuit 11 in the first embodiment according to the present invention. The OR gate 121 has two input terminals one of which is connected to the input port 15 and another is connected to the output terminal of the NAND gate 118. The output of the OR gate 121 is connected to the reset input terminal RN2 of the binary flip flop circuit 112. The OR gate 121 controls reset timing of the binary flip flop circuits 111, 112 and 113. If the output of the NAND gate 115 is changed from the low level to the high level, then the NAND gate 118 receives the output from the NAND gate 115 and the output from the invertor 119. The NAND gate 118 remains to output the low level signal until either the output from the NAND gate 115 and the output from the invertor 119 becomes low level.

The output of the NAND gate 118 is input into the reset inputs RN1 and RN3 of the binary flip flop circuits 111 and 113 whereby the binary flip flop circuits 111 and 113 are placed in reset states. As a result, the transistor 116 turns on whereby the reset signal MRESN is changed from the low level to the high level to release the read only memory 4 and the central processing unit 5 from the reset states and enter into the operational states. The reset input RN2 of the binary flip flop circuit 112 receives the output from the OR gate 121 having the two inputs, one of which is connected to the input port 15 and another is connected to the output terminal of the NAND gate 118. When the input port 15 is in the high level, the binary flip flop circuit 112 is not placed in the reset state whereby initial values of the binary flip flop circuits 111, 112 and 113 are varied, for which reason a time is shortened necessary for having the output terminal Q1 of the binary flip flop circuit 111 become high level. Thus, the time period of the high level of the reset signal MRESN is shortened. This shortens the necessary time for having the read only memory 4 and the central processing unit 5 return from the operational state into the reset states again.

The central processing unit 5 always returns into the reset state after operational state to release the runaway state thereof. Further, it is possible to control the operation time by the input port 15 to the necessary and limited time for reduction in power consumption.

What is claimed is:

1. A remote controller comprising:

a memory for storing data;

a central processing unit electrically connected to said memory for fetching data from said memory and supplying address signals to said memory;

an output port electrically connected to said central processing unit for receiving a remote control signal from said central processing unit;

a key source circuit electrically connected to said central processing unit for receiving set signals;

a key matrix electrically connected to said key source circuit;

a key return circuit electrically connected to said key matrix, said key return circuit also electrically connected to said central processing unit;

an oscillation circuit electrically connected to said central processing unit for generating a clock signal and supplying said clock signal to said central processing unit; and a reset circuit electrically connected to said central processing unit, said oscillation circuit and said key return circuit for placing at least said central processing unit in a reset state after power input, and, when any key input appears on said key matrix, for then releasing said central processing unit from said reset state to an operational state, and having said central processing unit return into said reset state thereafter.

2. The remote controller as claimed in claim 1, wherein said reset circuit has a plurality of binary flip flops for counting reset signals in power input; logic gates connected between said key return circuit and said binary flip flops for determining a reset timing of said binary flip flops on the basis of key data from said key return circuit; and a series connection of a transistor and a resistor between a power line and a ground line and both being provided on an output stage of said reset circuit for generating said reset signal.

3. The remote controller as claimed in claim 2, wherein said reset circuit further includes an OR gate for supplying a reset timing signal to any one of said binary flip flops.

* * * * *